(12) United States Patent
Nakamura et al.

(10) Patent No.: US 9,648,732 B2
(45) Date of Patent: May 9, 2017

(54) SEMICONDUCTOR DEVICE (71) Applicant: FUJI ELECTRIC CO., LTD., Kawasaki-shi (JP)

(72) Inventors: Youko Nakamura, Matsumoto (JP); Norihiro Nashida, Nagano (JP)

(73) Assignee: FUJI ELECTRIC CO, LTD., Kawasaki-Shi (JP)

( * ) Notice: Subject to any disclaimer, the term of this patent is extended or adjusted under 35 U.S.C. 154(b) by 147 days.

(21) Appl. No.: 14/455,052

(22) Filed: Aug. 8, 2014

(65) Prior Publication Data

US 2014/0347836 A1 Nov. 27, 2014

Related U.S. Application Data (63) Continuation of application No. PCT/JP2013/053292, filed on Feb. 12, 2013.

(30) Foreign Application Priority Data

Mar. 15, 2012 (JP) .................................. 2012-058729

(51) Int. Cl.
*H05K 1/18* (2006.01)
*H01L 23/28* (2006.01)
(Continued)

(52) U.S. Cl.
CPC .......... *H05K 1/0296* (2013.01); *H01L 21/56* (2013.01); *H01L 21/563* (2013.01); *H01L 23/12* (2013.01);
(Continued)

(58) Field of Classification Search
CPC ......... H01L 23/12; H01L 23/28; H01L 21/56; H01L 21/563; H01L 31/048; H01L 33/52; H01L 33/56
(Continued)

(56) References Cited

U.S. PATENT DOCUMENTS 5,527,620 A 6/1996 Schulz-Harder
5,942,797 A * 8/1999 Terasawa .............. H01L 25/162
257/703

(Continued)

FOREIGN PATENT DOCUMENTS

EP 0632681 A2 1/1995
JP 07-058282 A 3/1995
(Continued)

OTHER PUBLICATIONS

Japanese Office Action issued in Japanese counterpart application No. JP2014-504743, dated Nov. 4, 2015. Partial English translation provided.

(Continued)

*Primary Examiner* — Binh Tran
(74) *Attorney, Agent, or Firm* — Rossi, Kimms & McDowell LLP (57) ABSTRACT A semiconductor device includes: a conductive-patterned insulating substrate; conductive blocks fixed to conductive patterns of the conductive-patterned insulating substrate; a semiconductor chip fixed to each conductive block; a printed circuit board that has a conductive post fixed to the semiconductor chip; and a resin. The semiconductor device is configured such that the average volume of a conductive film per unit area of each conductive pattern around a section thereof, to which the corresponding conductive block is fixed, is reduced from the conductive block toward the outside.

13 Claims, 6 Drawing Sheets (51) Int. Cl.
*H05K 1/02* (2006.01)
*H01L 31/048* (2014.01)
*H01L 33/56* (2010.01)
*H01L 23/12* (2006.01)
*H01L 33/52* (2010.01)
*H01L 21/56* (2006.01)
*H01L 23/31* (2006.01)
*H01L 23/373* (2006.01)
*H01L 23/433* (2006.01)
*H01L 23/498* (2006.01)
*H01L 23/00* (2006.01)
*H05K 1/11* (2006.01)
*H05K 7/00* (2006.01)
*H01L 23/29* (2006.01)
*H01L 25/07* (2006.01)

(52) U.S. Cl.
CPC .......... *H01L 23/28* (2013.01); *H01L 23/3121* (2013.01); *H01L 23/3735* (2013.01); *H01L 23/4334* (2013.01); *H01L 23/49811* (2013.01); *H01L 23/49833* (2013.01); *H01L 24/01* (2013.01); *H01L 31/048* (2013.01); *H01L 33/52* (2013.01); *H01L 33/56* (2013.01); *H05K 1/115* (2013.01); *H05K 1/185* (2013.01); *H01L 25/072* (2013.01); *H01L 2924/15747* (2013.01); *H01L 2924/15787* (2013.01); *H01L 2924/351* (2013.01); *H05K 2201/098* (2013.01); *H05K 2201/09609* (2013.01); *H05K 2201/09727* (2013.01)

(58) Field of Classification Search
USPC ......... 361/748, 764, 783; 174/521; 257/787, 257/788, 789, 792, 793
See application file for complete search history.

(56) References Cited

U.S. PATENT DOCUMENTS

| | | | |
|---|---|---|---|
| 6,798,060 | B2 | 9/2004 | Strauch |
| 2003/0096450 | A1 | 5/2003 | Strauch |
| 2005/0263482 | A1* | 12/2005 | Takakusaki ......... H01L 21/4821 216/13 |
| 2008/0206928 | A1 | 8/2008 | Onishi et al. |
| 2012/0241953 | A1 | 9/2012 | Yamada et al. |

FOREIGN PATENT DOCUMENTS

| | | |
|---|---|---|
| JP | 08-274423 A | 10/1996 |
| JP | 2002-299495 A | 10/2002 |
| JP | 2006-237058 A | 9/2006 |
| JP | 2008-207207 A | 9/2008 |
| JP | 2009-064852 A | 3/2009 |
| JP | 2009-088176 A | 4/2009 |
| JP | 2009-094135 A | 4/2009 |
| JP | 2010165764 A | 7/2010 |
| WO | 2011083737 A1 | 7/2011 |

OTHER PUBLICATIONS

International Search Report issued in PCT/JP2013/053292 mailed May 14, 2013.
Extended European Search Report issued in EP13760607.5, mailed Oct. 15, 2015.
Office Action issued in Chinese Appln. No. 201380012379.1 mailed May 25, 2016. English translation provided.

* cited by examiner

SEMICONDUCTOR DEVICE

CROSS REFERENCE TO RELATED APPLICATIONS

This application is a continuation of International Application No. PCT/JP2013/053292, filed on Feb. 12, 2013, which is based on and claims priority to Japanese Patent Application No. JP 2012-058729, filed on Mar. 15, 2012. The disclosure of the Japanese priority application and the PCT application in their entirety, including the drawings, claims, and the specification thereof, are incorporated herein by reference.

BACKGROUND

Field of the Invention

Embodiments of the present invention relate to a semiconductor device such as a power semiconductor module.

Discussion of the Background

Figure 11:
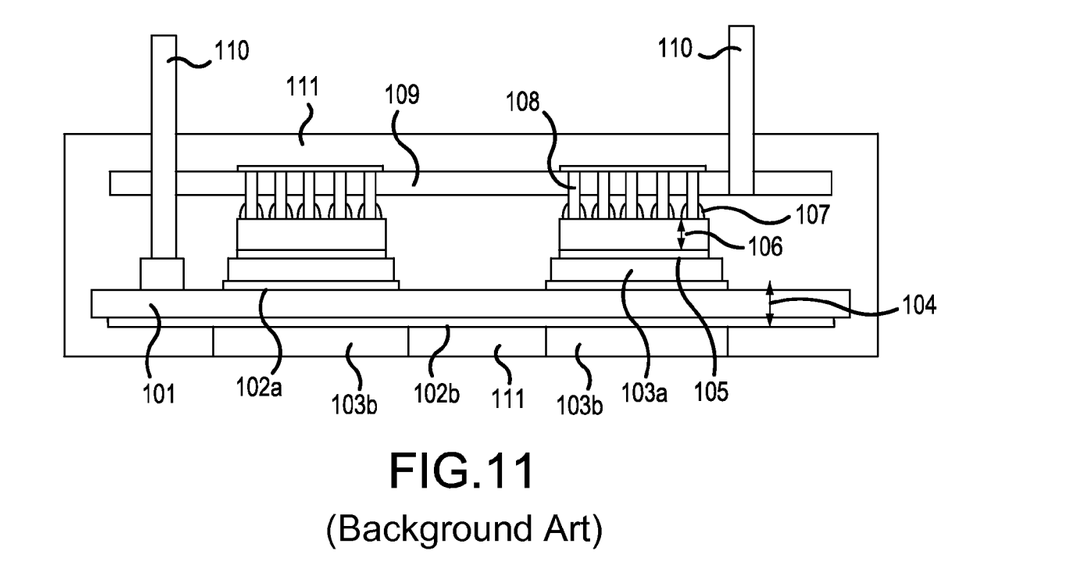
FIG. 11 is a cross-sectional diagram showing the principal parts of a conventional semiconductor device.

FIG. 11 is a cross-sectional diagram showing the principal parts of a conventional semiconductor device having a structure similar to the one described in Japanese Patent Application Laid-open No. 2009-64852 ("Patent Document 1"). A power semiconductor module as the conventional semiconductor device has a DCB (Direct Copper Bonding) substrate 104, a conductive-patterned insulating substrate, which is configured by an insulating substrate 101 and copper circuit patterns 102a, 102b formed on the front and back of the insulating substrate 101. This power semiconductor module also has a copper block 103a fixed to the copper circuit pattern 102a of the DCB substrate 104 by means of diffusion bonding or the like, and a copper block 103b fixed to the copper circuit pattern 102b of the DCB substrate 104 by means of diffusion bonding or the like. This power semiconductor module has a semiconductor chip 106 having the rear surface thereof soldered or the like onto the copper block 103a by a bonding material 105, a conductive post 108 soldered or the like to an upper electrode of the semiconductor chip 106 by a bonding material 107, and a printed circuit board 109 with the conductive post 108. The power semiconductor module further has a sealing resin 111 for sealing the semiconductor chip 106, the DCB substrate 104, and the printed circuit board 109. Reference numeral 110 represents an external lead terminal.

Japanese Patent Application Laid-open No. 2009-94135 ("Patent Document 2"), on the other hand, describes that, when soldering a power semiconductor chip to a DCB substrate, a plurality of stress relaxation dimples are provided to the rim of a conductive pattern along the border between the ceramic substrate and the conductive pattern.

Japanese Patent Application Laid-open No. 2009-88176 ("Patent Document 3") describes that an outer circumferential rim of a metal layer bonding a circuit member and a support base together has irregularities, as viewed planarly, in order to reduce a thermal stress applied repeatedly to a heat dissipation base.

Moreover, Japanese Patent Application Laid-open No. H8-274423 ("Patent Document 4") discloses a ceramic circuit board configured by bonding a metal plate, such as a copper plate, to a ceramic substrate by means of a direct bonding method or active metal soldering method, wherein intermittent grooves are formed on the inside of an outer circumferential rim portion in a linear manner along, for example, the outer circumferential rim portion at predetermined intervals, the outer circumferential rim portion being located on the side opposite to the bonded surface of the copper plate. Patent Document 4 describes that such configuration can effectively prevent the ceramic substrate from cracking or a decrease in the intensity thereof even when a cooling/heating cycle is employed.

In a resin-sealed type semiconductor, the adhesion of the resin to the embedded members has a significant impact on the reliability of this semiconductor. In the structure shown in FIG. 11, a stress occurs between the sealing resin 111 and the copper circuit patterns 102a, 102b made of copper in the vicinity of the insulating substrate 101, due to the difference in linear expansion coefficient between the insulating substrate 101 made of ceramic and the copper circuit patterns 102a, 102b, which configure the DCB substrate 104. This leads to a problem in which the DCB substrate 104 and the sealing resin 111 peel off of each other.

When the DCB substrate 104 equipped with the semiconductor chip 106 and the sealing resin 111 continue to peel off of each other, a stress concentrates on the bonded section between the semiconductor chip 106 and the copper block 103a as well, deteriorating the bonded section, which becomes a cause of failure of the semiconductor module.

In particular, insulation failure occurs when the peeling between the copper circuit pattern 102a and the sealing resin 111 develops to affect the insulating substrate 101. Even if the sealing resin 111 is adhered only to the insulating substrate 101 and peels off of the copper circuit pattern 102a, stress concentrates on a part of the insulating substrate 101 near the copper circuit pattern 102a, generating cracks in the insulating substrate 101 and consequently resulting in, again, insulation failure.

A power semiconductor module equipped with a WBG (Wide Band Gap) element such as a SiC (silicon carbide) device, which has recently been employed, has a wider operating temperature range than a conventional power semiconductor module equipped with a Si (silicon) device and is therefore driven at temperature equal to or higher than the temperature for driving the power semiconductor module equipped with a Si device (Tjmax≥175 C.°). This further increases the level of thermal stress and is assumed to cause the peeling of the sealing resin 111 described above, deteriorating the reliability of the power semiconductor module.

SUMMARY

Patent Documents 1 to 4 do not mention that reducing the average volume of the copper of the copper circuit patterns around the copper blocks from the copper blocks toward the outside, not only alleviates the difference in linear expansion coefficient between the insulating substrate and the copper circuit patterns but also prevents a thermal stress from locally concentrating, and further prevents the resin from peeling.

Embodiments of the present invention provide a semiconductor device such as a resin-sealed type power semiconductor module, which is capable of keeping the adhesion of sealing resin and improving the reliability and life of the module.

Embodiments of the present invention provide a semiconductor device having: a conductive-patterned insulating substrate (e.g., a DCB substrate, etc.); a conductive block (e.g., a copper block, etc.) fixed to a conductive pattern (e.g., a circuit pattern, etc.) of the conductive-patterned insulating substrate; a semiconductor chip fixed to the conductive block; a printed circuit board that has a conductive post fixed to the semiconductor chip; and a resin (sealing resin) for sealing these constituents, wherein the conductive block is disposed such that an average volume of a conductive film per unit area of the conductive pattern around a section thereof, to which the conductive block is fixed, decreases from the conductive block toward the outside.

According to embodiments of the present invention, drill holes may be formed in the conductive pattern around the section thereof, to which the conductive block is fixed, such that the number of drill holes per unit area increases from the conductive block toward the outside, thereby reducing a volume of the conductive film of the conductive pattern.

According to embodiments of the present invention, drill holes may be formed in the conductive pattern around the section thereof, to which the conductive block is fixed, such that cross-sectional areas of the drill holes increase from the conductive block toward the outside, thereby reducing the volume of the conductive film of the conductive pattern.

According to embodiments of the present invention, annular drill grooves may be formed in the conductive pattern around the section thereof, to which the conductive block is fixed, such that the number of annular drill grooves per unit length increases from the conductive block toward the outside, thereby reducing the volume of the conductive film of the conductive pattern.

According to embodiments of the present invention, annular drill grooves may be formed in the conductive pattern around the section thereof, to which the conductive block is fixed, such that widths of the annular drill grooves increase from the conductive block toward the outside, thereby reducing the volume of the conductive film of the conductive pattern.

According to embodiments of the present invention, the drill holes or annular drill grooves may have bottom portions closed with the conductive film.

According to embodiments of the present invention, a thickness of the conductive pattern around the section thereof, to which the conductive block is fixed, may be gradually reduced from the conductive block toward the outside, thereby reducing the volume of the conductive film of the conductive pattern.

According to embodiments of the present invention, the conductive pattern around the section thereof, to which the conductive block is fixed, may be provided with drill holes or annular drill grooves.

According to embodiments of the present invention, a cross-sectional shape of the conductive pattern that gradually becomes thin, may be a slope shape or a step shape.

According to embodiments of the present invention, the conductive pattern may be bonded to a front surface of the conductive-patterned insulating substrate, the conductive block and the semiconductor chip may be sequentially fixed onto the conductive pattern, another conductive pattern may be bonded to a rear surface of the conductive-patterned insulating substrate, another conductive block may be fixed to the latter conductive pattern, and one principal surface of the other conductive block may be exposed from the resin.

According to embodiments of the present invention, the conductive pattern and the other conductive pattern may be metal films and the conductive block and the other conductive block may be metal blocks.

According to embodiments of the present invention, the conductive block is disposed in the conductive pattern of the conductive-patterned insulating substrate to which the conductive block is fixed, such that the average volume per unit area of the conductive pattern around the section thereof, to which the conductive block is fixed, decreases from the conductive block toward the outside. Such configuration can improve not only the adhesive properties of the sealing resin to the conductive-patterned insulating substrate but also the reliability and life of the semiconductor device.

BRIEF DESCRIPTION OF THE DRAWINGS

FIG. 9 shows the principal parts of the DCB substrate of a semiconductor device according to a fourth example of the present invention, where

DESCRIPTION OF ILLUSTRATED EMBODIMENTS

Embodiments for implementing the present invention are characterized in alleviating the difference in linear expansion coefficient between a copper circuit pattern around a copper block and an insulating substrate by gradually reducing the average volume per unit area of copper of the copper circuit pattern toward the outside, and thereby preventing a thermal stress from locally concentrating and resin from peeling. A method for changing the density of drill holes disposed, the area covered by annular drill grooves, and the thickness of a conductive film, is considered as a method for reducing the average volume. In addition, the anchor effect can be obtained by forming the drill holes or the annular drill grooves, which eventually prevent the resin from peeling. The embodiments are now described below by taking the following examples.

Example 1

Figure 1:
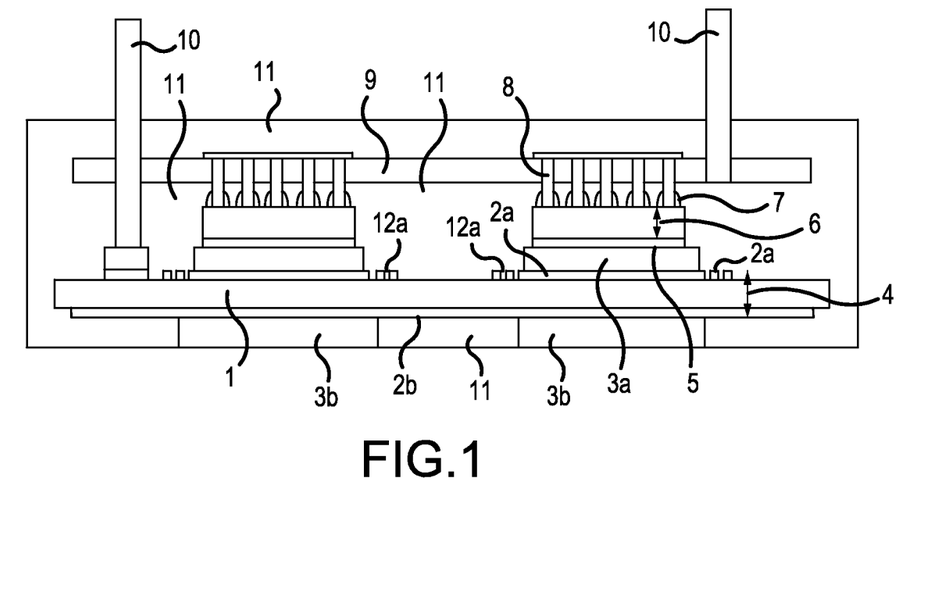
FIG. 1 is a cross-sectional diagram showing the principal parts of a semiconductor device according to a first example of the present invention.
Figure 2:
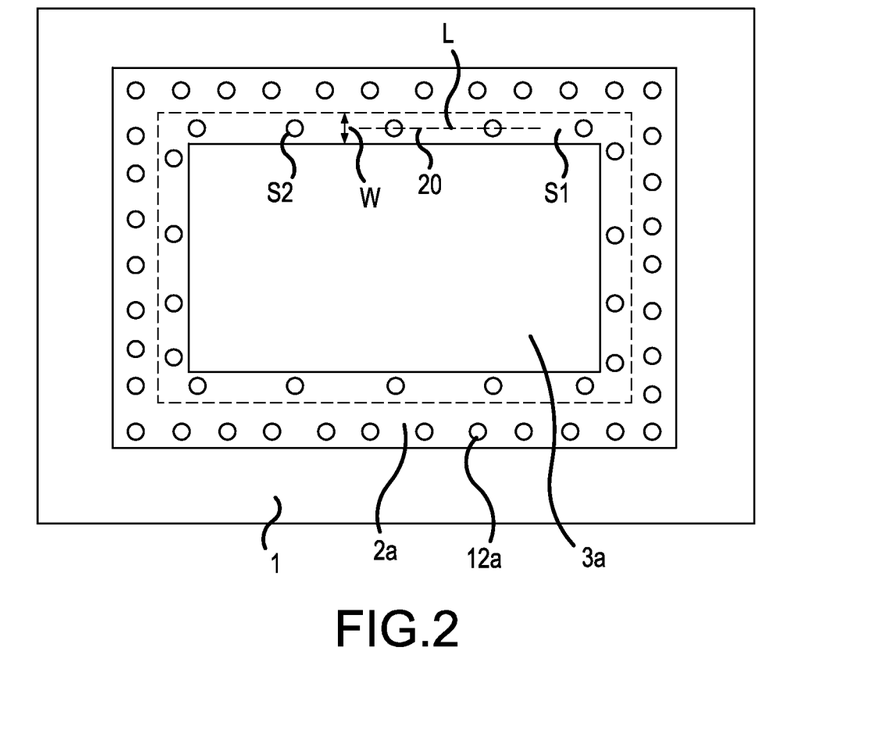
FIG. 2 is a plan view showing the principal parts of a DCB substrate shown in FIG. 1.

FIG. 1 is a cross-sectional diagram showing the principal parts of a semiconductor device according to a first example of the present invention. FIG. 2 is a plan view showing the principal parts of a DCB substrate shown in FIG. 1. In FIG. 1, a semiconductor power module, the semiconductor device, has a DCB (Direct Copper Bonding) substrate 4, which is a conductive-patterned insulating substrate configured by an insulating substrate 1 and copper circuit patterns 2a, 2b formed respectively on the front and back of the insulating substrate 1. This semiconductor module has copper blocks 3a fixed to the copper circuit patterns 2a of the DCB substrate 4 by diffusion bonding or the like, and copper blocks 3b fixed to the copper circuit pattern 2b of the DCB substrate 4 by diffusion bonding or the like. This semiconductor power module also has semiconductor chips 6 having the rear surfaces thereof soldered or the like onto the copper blocks 3a by bonding materials 5, conductive posts 8 soldered or the like to an upper electrode of each semiconductor chip 6 by a bonding material 7, and a printed circuit board 9 with the conductive posts 8. In this semiconductor module, external lead terminals 10 are fixed to each copper block 3a and the printed circuit board 9 respectively by bonding materials (not shown). This semiconductor power module further has a sealing resin 11 for sealing the semiconductor chips 6, the DCB substrate 4, and the printed circuit board 9. An end portion of one of the external lead terminals 10 and one principal surface of each copper block 3b are exposed outside the sealing resin 11.

As shown in FIG. 2, each copper circuit pattern 2a has a plurality of small drill holes 12a disposed therein which have a circular cross-sectional shape as viewed planarly and are opened all the way up to the front surface of the insulating substrate 1. These drill holes 12a are disposed in such a manner that the number of drill holes 12a per unit area increases toward the outside of the edge of the corresponding copper block 3a, so that the volume of a copper film per unit area of the copper circuit pattern 2a decreases toward the outside.

According to this configuration, the average volume density of the copper film decreases toward the outside, by increasing the number of drill holes 12a of the copper circuit pattern 2a toward the outside from the copper block 3a. The equations $S1=L\times W$, $S3=S2\times n$, and $So=(S1-S3)/S1$ are established, where L represents the length of a center line 20 stretched along the drill holes 12a disposed around the copper block, W a predetermined width (e.g., width obtained by multiplying the diameter of the drill holes by over 1), S1 the area of the annular belt, S2 the area of each drill hole 12a, n the number of drill holes 12a present in the annular area S1, S3 the total area of the drill holes 12a present in the annular area S1, and So the average area density of copper. The average area density So is reduced toward the outside of the copper block. The average volume density Vo is expressed by $(So \times t)$ where the average area density So is multiplied by a thickness t of the copper circuit pattern 2a. This average volume density Vo is reduced gradually from the copper block 3a toward the outside.

The resin 11 is packed and hardened in the drill holes 12a formed in the copper circuit pattern 2a as a result of sealing these components. As a result of hardening the resin 11, chemical bonding between the resin 11 and the members (e.g., the copper circuit pattern 2a) enables adhesion thereof, and packing the resin 11 in the drill holes 12a and then hardening the resin 11 prevents the resin 11 from physically peeling (the anchor effect).

Moreover, in the entire DCB substrate 4, a section that seemingly has a large number of drill holes 12a has a lower area (volume) of copper circuit pattern, and the ratio of the volume of the copper film of the copper circuit pattern to the ceramic configuring the insulating substrate 1 is low. Consequently, the linear expansion coefficient of the copper circuit pattern becomes approximate to that of the insulating substrate. On the other hand, a section with a small number of drill holes 12a has a larger area (volume) of copper circuit pattern 2a, and the ratio of the volume of the copper of the copper circuit pattern to the ceramic is high. Consequently, the linear expansion coefficient of the copper circuit pattern becomes approximate to that of the copper.

Therefore, reducing the area (volume) of the copper in the vicinity of the ceramic (the copper circuit pattern 2a away from the copper block 3a) and increasing the area (volume) of the copper in the vicinity of the copper block 3a, can alleviate the difference in linear expansion coefficient between the copper circuit pattern 2a and the ceramic which is the insulating substrate 1, and avoid local concentration of a thermal stress between the sealing resin and the copper circuit pattern near the insulating substrate around the semiconductor chips that generate heat. As a result, coupled with the anchor effect of the drill holes 12a, the resin 11 can be prevented from peeling off. In addition, insulation failure due to cracks in the ceramic can be prevented, realizing high reliability of the semiconductor device.

Although not shown in FIG. 1, drill holes may similarly be formed in the copper circuit pattern 2b on the back of the insulating substrate 1 on which the semiconductor chips 6 are not mounted. The semiconductor device is used in such a manner that the principal surfaces of the copper blocks 3b come into contact with a cooler. Although the temperature of the periphery of each copper block 3b is lower than that of each copper block 3a to which the corresponding semiconductor chip 6 is fixed, when the ratio of the area of the copper circuit pattern 2b to that of the insulating substrate 1, the overall difference in linear expansion coefficient between the insulating substrate 1 and the copper circuit patterns 2a, 2b can be reduced by forming both of the copper circuit patterns 2a, 2b, thereby improving the reliability of the semiconductor device.

Figure 3:
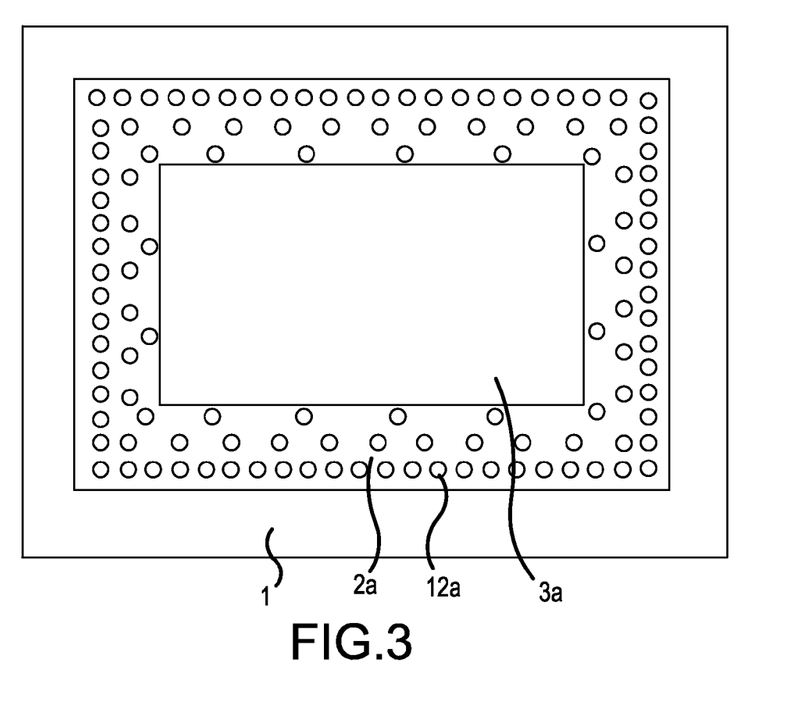
FIG. 3 is a plan view showing the principal parts of the DCB substrate with an increased number of drill holes.

Moreover, the anchor effect can be enhanced by increasing the number of drill holes 12a as shown in FIG. 3, further preventing the resin 11 from peeling off.

Example 2

Figure 4:
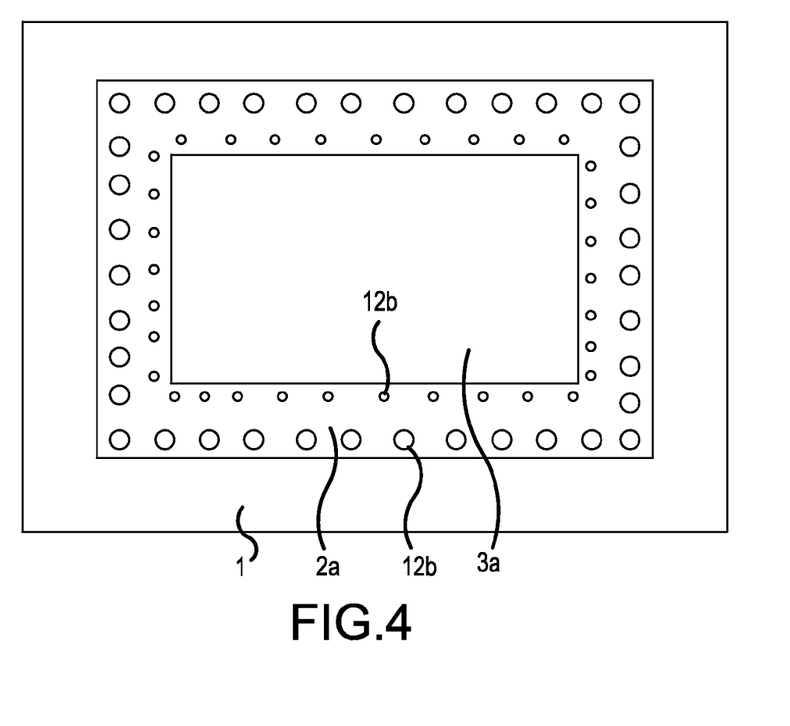
FIG. 4 is a plan view showing the principal parts of the DCB substrate of a semiconductor device according to a second example of the present invention.

FIG. 4 is a plan view showing the principal parts of a semiconductor device according to a second example of the present invention. This diagram is a plan view of the principal parts of the DCB substrate 4 configuring the semiconductor device. This plan view corresponds to the plan view shown in FIG. 2.

The difference with FIG. 2 is that the size (cross-sectional area) of each drill hole 12b is changed while keeping the number of drill holes per unit area unchanged. The same effect as that described in Example 1 can be achieved by forming small drill holes 12b in the vicinity of each copper block 3a and large drill holes 12b away therefrom.

Figure 5:
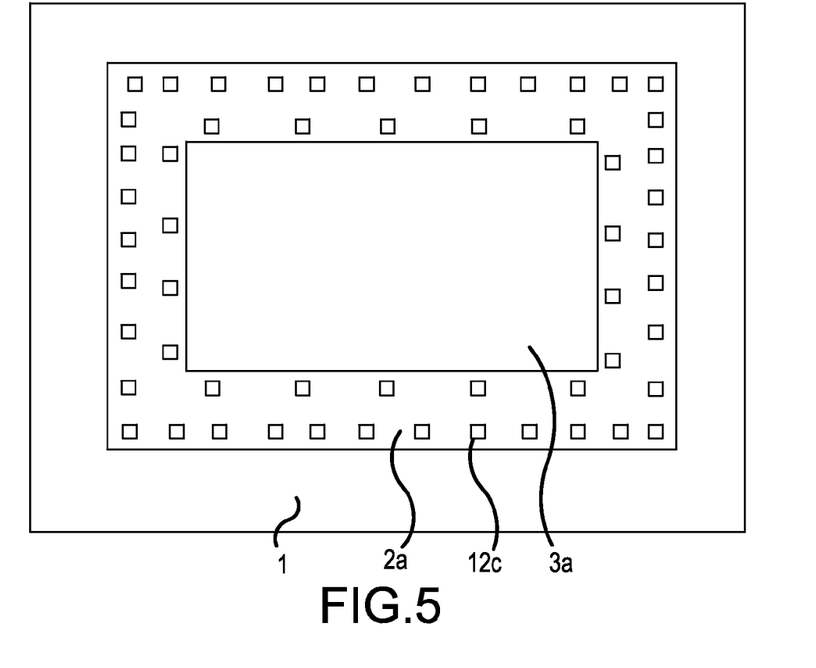
FIG. 5 is a plan view showing the principal parts of the DCB substrate with planarly rectangular drill holes.

In both Examples 1 and 2, the drill holes 12a, 12b are in a circular shape; however, the shape of the drill holes is not limited thereto. Thus, rectangular drill holes 12c may be formed, as shown in FIG. 5. Alternatively, both rectangular and circular drill holes may be present.

Example 3

Figure 6:
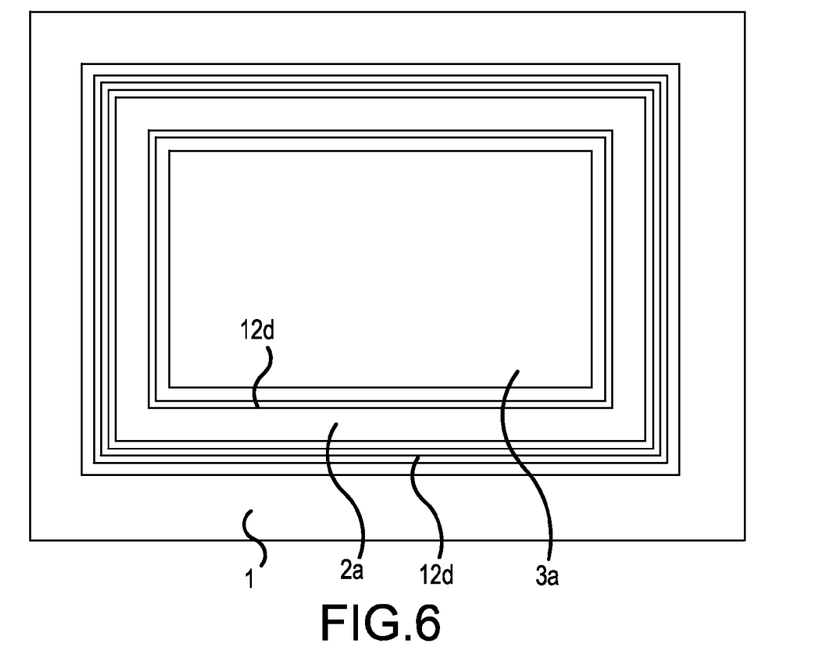
FIG. 6 is a plan view showing the principal parts of the DCB substrate of a semiconductor device according to a third example of the present invention.

FIG. 6 is a plan view showing the principal parts of a semiconductor device according to a third example. This diagram is a plan view showing the principal parts of the DCB substrate 4 configuring the semiconductor device. This plan view corresponds to the plan view shown in FIG. 2.

Figure 7:
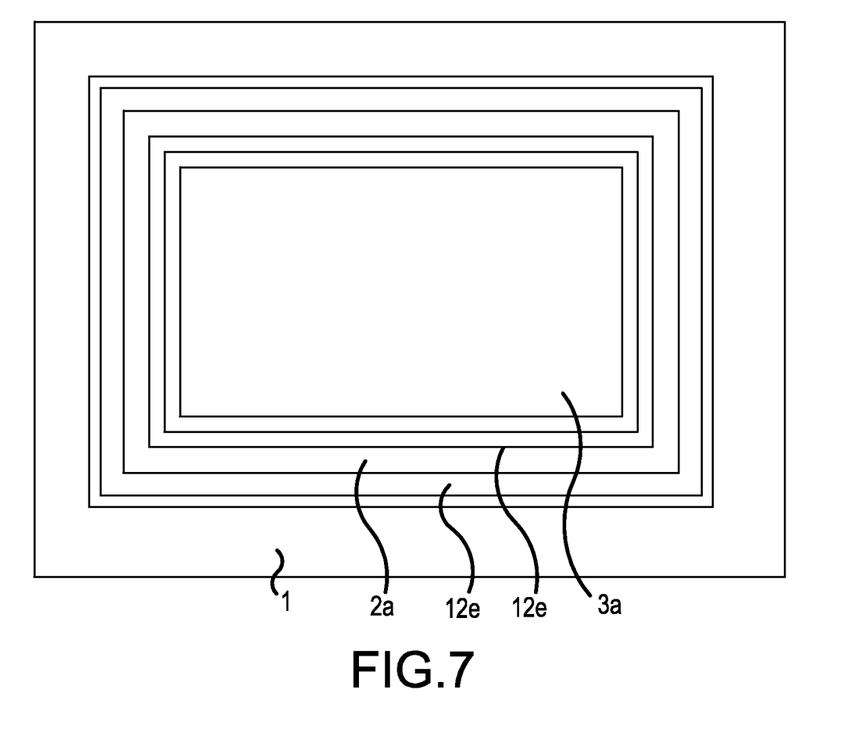
FIG. 7 is a plan view showing the principal parts of the DCB substrate in which the width of annular drill holes is expanded toward the outside.

The difference with FIG. 2 is that the drill holes 12a to be formed are changed to annular drill grooves 12d. The number of annular drill grooves 12d per unit length in the direction from each copper block 3a toward the outside is increased toward the outside (so that the grooves are disposed densely), to reduce the area of the copper in the vicinity of the ceramic away from the copper block and increase the area of the copper in the vicinity of the copper block. With this configuration, the same effect as that of Example 1 can be achieved. The same effect can be obtained even by expanding the widths of drill grooves 12e toward the outside, as shown in FIG. 7. Although not shown, the annular drill grooves 12d, 12e do not have to be disposed in an annular fashion but can be formed intermittently, so the drill grooves exist partially in the semiconductor device.

Figure 8:
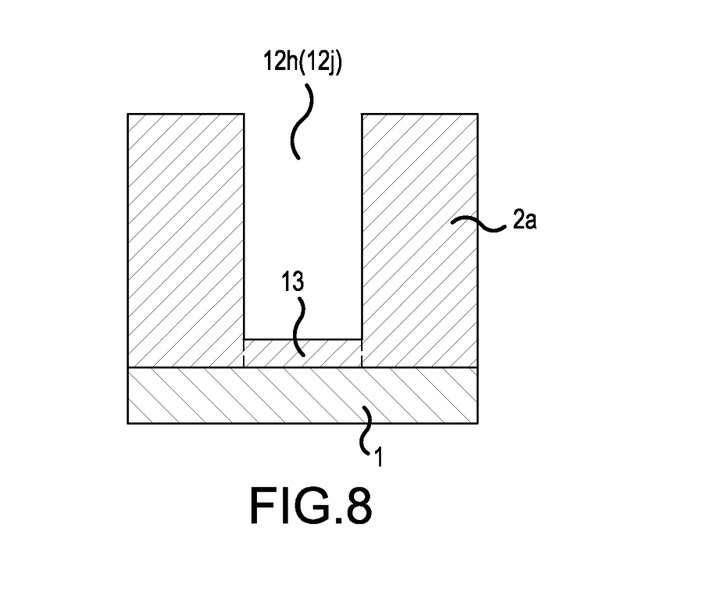
FIG. 8 is a cross-sectional diagram showing the principal parts of the DCB substrate having a structure in which a thin copper layer is kept at the bottom of the insulating substrate without allowing a drill hole 12$h$ or annular drill groove 12$j$ to pass through the insulating substrate.

In Examples 1 to 3, the same effect can be obtained even with a configuration in which a thin copper layer is kept at a bottom portion 13 without allowing a drill hole 12h or annular drill groove 12j to pass through the front surface of the insulating substrate 1, as shown in the cross-sectional diagram of FIG. 8. In addition, the same effect can be achieved even by gradually reducing the thickness of the kept copper layer from the copper block 3a toward the outside.

Example 4

Figure 9A:
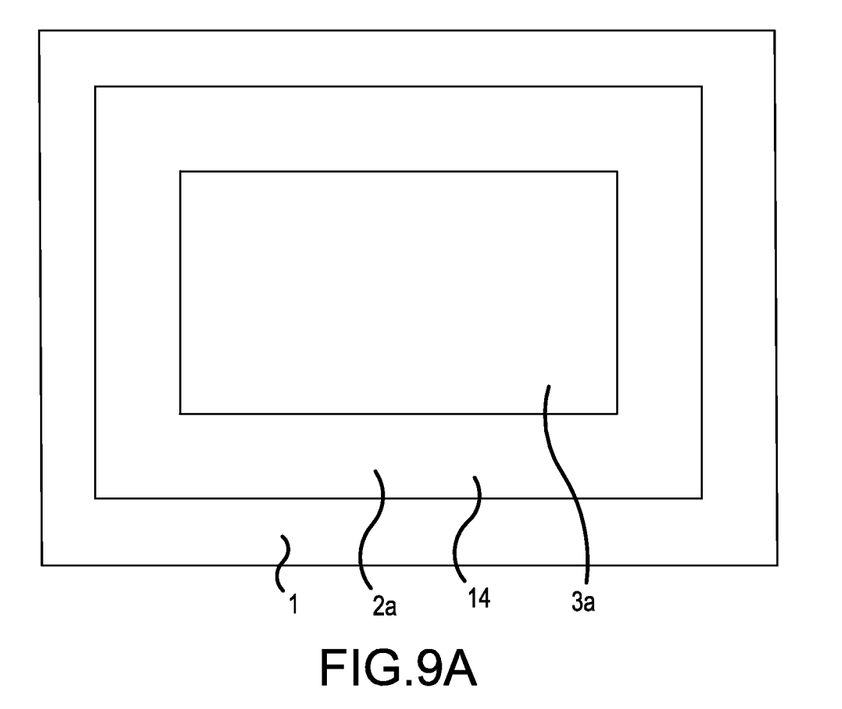
FIG. 9(A) is a plan view of the principal parts and FIG. 9(B) a cross-sectional diagram of the same.
Figure 9B:
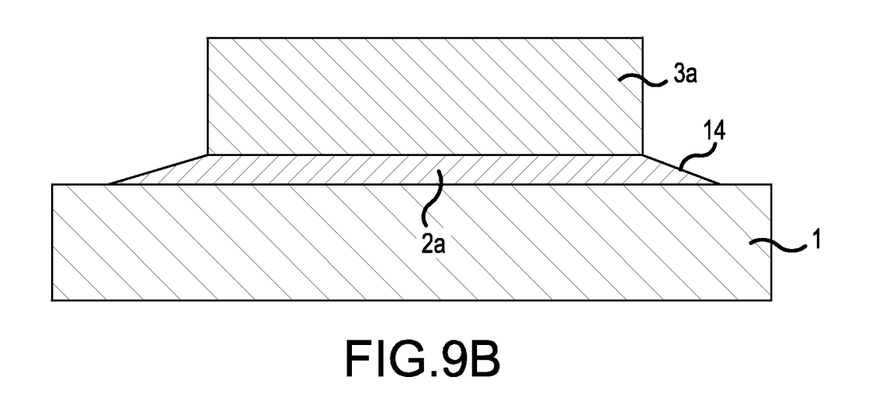
Figure 10:
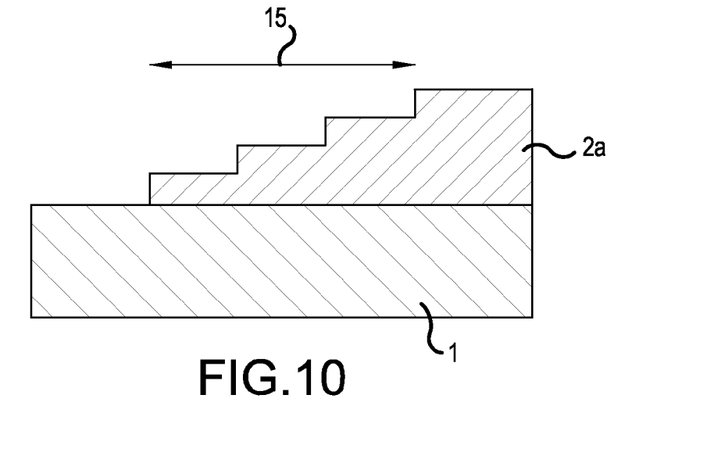
FIG. 10 is a cross-sectional diagram showing the principal parts of the DCB substrate in which a slope-like copper circuit pattern 14 shown in FIG. 9 is formed into a step-like copper circuit pattern 15.

FIG. 9 shows the principal parts of the DCB substrate of a semiconductor device according to a fourth example of the present invention, where FIG. 9(A) is a plan view of the principal parts and FIG. 9(B) a cross-sectional diagram of the same. The difference with FIG. 2 is that thickness of each copper circuit pattern 2a is changed without forming any drill holes. The same effect can be obtained by configuring a slope-like copper circuit pattern 14 that gradually becomes thin toward the outside at a constant rate. The same effect can be realized even by configuring a step-like copper circuit pattern 15 that gradually becomes thin, not in the form of a slope, but in a step like manner, as shown in FIG. 10. Although not shown, the anchor effect can occur by disposing drill holes or annular drill grooves evenly in this structure, further improving the adhesion of the resin 11.

The invention claimed is:
1. A semiconductor device, comprising:
an insulating substrate;
a conductive pattern disposed on the insulating substrate;
a conductive block disposed on the conductive pattern;
a semiconductor chip disposed on the conductive block;
a printed circuit board comprising a conductive post coupled to the semiconductor chip; and
a resin disposed on the semiconductor chip and printed circuit board,
wherein the conductive pattern comprises holes, and the number of holes per unit area of the conductive pattern increases in the direction away from the conductive block such that a first portion of the conductive pattern includes a first number of holes per unit area, a second portion of the conductive pattern includes a second number of holes per unit area, the second number of holes being greater than the first number of holes, and the first portion of the conductive pattern is disposed between the conductive block and the second portion of the conductive pattern.
2. The semiconductor device according to claim 1, wherein the conductive pattern comprises annular grooves, and widths of the annular grooves increase in the direction away from the conductive block.

3. The semiconductor device according to claim 1, wherein a thickness of the conductive pattern exceeds a depth of the holes.
4. The semiconductor device according to claim 1, wherein a thickness of the conductive pattern decreases in the direction away from the conductive block.
5. The semiconductor device according to claim 4, wherein the conductive pattern comprises holes or annular grooves.
6. The semiconductor device according to claim 4, wherein a cross-sectional shape of the conductive pattern is a slope shape or a step shape.
7. The semiconductor device according to claim 1, wherein
the conductive pattern is disposed on a front surface of the insulating substrate, the conductive block and the semiconductor chip are sequentially disposed on the conductive pattern, another conductive pattern is disposed on a rear surface of the insulating substrate, and another conductive block is disposed on the another conductive pattern, and
a surface of the another conductive block is exposed outside the resin.
8. The semiconductor device according to claim 7, wherein the conductive pattern and the another conductive pattern are metal films, and the conductive block and the another conductive block are metal blocks.
9. The semiconductor device according to claim 1, further comprising bonding material disposed between the semiconductor chip and the conductive block and bonding the semiconductor chip to the conductive block.
10. The semiconductor device according to claim 1, wherein the conductive pattern comprises copper and the conductive block comprises copper.
11. A semiconductor device, comprising:
an insulating substrate;
a conductive pattern disposed on the insulating substrate;
a conductive block disposed on the conductive pattern;
a semiconductor chip disposed on the conductive block;
a printed circuit board comprising a conductive post coupled to the semiconductor chip; and
a resin disposed on the semiconductor chip and printed circuit board,
wherein the conductive pattern comprises holes, and cross-sectional areas of the holes increase in the direction away from the conductive block such that a first portion of the conductive pattern includes first holes having a first cross-sectional area, a second portion of the conductive pattern includes second holes having a second cross-sectional area greater than the first cross-sectional area, and the first portion of the conductive pattern is disposed between the conductive block and the second portion of the conductive pattern.
12. A semiconductor device, comprising:
an insulating substrate;
a conductive pattern disposed on the insulating substrate;
a conductive block disposed on the conductive pattern;
a semiconductor chip disposed on the conductive block;
a printed circuit board comprising a conductive post coupled to the semiconductor chip; and
a resin disposed on the semiconductor chip and printed circuit board,
wherein the conductive pattern comprises annular grooves, and the number of annular grooves per unit length increases in the direction away from the conductive block.

13. The semiconductor device according to claim 12, wherein a thickness of the conductive pattern exceeds a depth of the grooves.

* * * * *